(12) United States Patent
Wu et al.

(10) Patent No.: US 9,368,458 B2
(45) Date of Patent: Jun. 14, 2016

(54) DIE-ON-INTERPOSER ASSEMBLY WITH DAM STRUCTURE AND METHOD OF MANUFACTURING THE SAME

(71) Applicant: Taiwan Semiconductor Manufacturing Company, Ltd., Hsin-Chu (TW)

(72) Inventors: Chih-Wei Wu, Zhuangwei Township (TW); Szu Wei Lu, Hsinchu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 185 days.

(21) Appl. No.: 13/938,821

(22) Filed: Jul. 10, 2013

(65) Prior Publication Data

US 2015/0014844 A1 Jan. 15, 2015

(51) Int. Cl.
*H01L 23/58* (2006.01)
*H01L 23/498* (2006.01)
*H01L 23/00* (2006.01)
(Continued)

(52) U.S. Cl.
CPC ............ *H01L 23/585* (2013.01); *H01L 21/486* (2013.01); *H01L 21/56* (2013.01); *H01L 21/561* (2013.01); *H01L 21/76898* (2013.01); *H01L 23/10* (2013.01); *H01L 23/147* (2013.01); *H01L 23/16* (2013.01); *H01L 23/481*; *H01L 23/49811* (2013.01); *H01L 23/49816* (2013.01); *H01L 23/49827* (2013.01); *H01L 23/544* (2013.01); *H01L 23/564* (2013.01); *H01L 24/17* (2013.01); *H01L 24/81* (2013.01); *H01L 24/94* (2013.01); *H01L 24/97* (2013.01); *H01L 25/0652* (2013.01); *H01L 25/0657* (2013.01); *H01L 25/50* (2013.01); *H01L 23/562* (2013.01); *H01L 2224/0401* (2013.01); *H01L 2224/05572* (2013.01); *H01L 2224/06181* (2013.01); *H01L 2224/16145* (2013.01); *H01L 2224/16225* (2013.01); *H01L 2224/1703* (2013.01); *H01L 2224/17181* (2013.01); *H01L 2224/17505* (2013.01); *H01L 2224/17517* (2013.01); *H01L 2224/32145* (2013.01); *H01L 2224/73204* (2013.01); *H01L 2224/81139* (2013.01); *H01L 2224/92124* (2013.01); *H01L 2224/94* (2013.01); *H01L 2224/97* (2013.01); *H01L 2225/06513* (2013.01); *H01L 2225/06541* (2013.01); *H01L 2924/01322* (2013.01); *H01L 2924/12042* (2013.01); *H01L 2924/181* (2013.01); *H01L2924/18161* (2013.01); *H01L 2924/3511* (2013.01)

(58) Field of Classification Search
CPC ............ H01L 23/49816; H01L 23/481; H01L 21/561; H01L 21/56; H01L 25/0652; H01L 24/81; H01L 25/50; H01L 24/97; H01L 25/0657; H01L 24/17; H01L 24/94; H01L 23/49811
See application file for complete search history.

(56) References Cited

U.S. PATENT DOCUMENTS 7,432,602 B2 10/2008 Kuramochi
8,692,357 B2 * 4/2014 Ning ........................ H01L 21/78
257/620

(Continued)

*Primary Examiner* — John P Dulka
(74) *Attorney, Agent, or Firm* — Slater Matsil, LLP

(57) ABSTRACT

A semiconductor package includes an interposer chip having a frontside, a backside, and a corner area on the backside defined by a first corner edge and a second corner edge of the interposer chip. A die is bonded to the frontside of the interposer chip. At least one dam structure is formed on the corner area of the backside of the interposer chip. The dam structure includes an edge aligned to at least one the first corner edge and the second corner edge of the interposer chip.

18 Claims, 8 Drawing Sheets

(51) Int. Cl.
  *H01L 23/16*   (2006.01)
  *H01L 23/544*  (2006.01)
  *H01L 23/10*   (2006.01)
  *H01L 25/065*  (2006.01)
  *H01L 25/00*   (2006.01)
  *H01L 21/56*   (2006.01)
  *H01L 23/48*   (2006.01)
  *H01L 23/14*   (2006.01)
  *H01L 21/48*   (2006.01)
  *H01L 21/768*  (2006.01)

(56) References Cited

U.S. PATENT DOCUMENTS

| | | |
|---|---|---|
| 8,829,667 B2 | 9/2014 | Park et al. |
| 2001/0038144 A1* | 11/2001 | Grigg ............................ 257/698 |
| 2010/0127377 A1 | 5/2010 | Bauer et al. |
| 2011/0031591 A1* | 2/2011 | Min .................... H01L 23/3128 257/618 |
| 2011/0210436 A1* | 9/2011 | Chow et al. .................... 257/686 |
| 2012/0068353 A1* | 3/2012 | Huang et al. ................... 257/774 |
| 2012/0098123 A1* | 4/2012 | Yu et al. ......................... 257/737 |
| 2012/0126395 A1* | 5/2012 | Lee ....................... H01L 21/561 257/737 |
| 2012/0305916 A1 | 12/2012 | Liu et al. |
| 2013/0075937 A1 | 3/2013 | Wang et al. |
| 2013/0341773 A1 | 12/2013 | Bauer et al. |
| 2014/0036466 A1 | 2/2014 | Pahl et al. |
| 2014/0353838 A1 | 12/2014 | Lin et al. |
| 2014/0367854 A1* | 12/2014 | Zhao .................... H05K 3/4688 257/738 |
| 2015/0008580 A1* | 1/2015 | Joh .................... H01L 23/49811 257/738 |

* cited by examiner

DIE-ON-INTERPOSER ASSEMBLY WITH DAM STRUCTURE AND METHOD OF MANUFACTURING THE SAME

BACKGROUND

A common requirement of current integrated circuit manufacturing and packaging is the use of interposers to receive single or multiple integrated circuit dies. The use of through vias or through silicon vias extending through the interposers is increasing. These through vias allow electrical coupling between integrated circuit dies and components mounted on one side of an interposer, and terminals such as solder balls mounted on the opposite side of the interposer. Further, the through via technologies enable wafer level processing of the interposer assemblies. This technique is increasingly applicable to increasing memory or storage device density, for example, without added circuit board area. As demand for hand held and portable devices such as smart phones and tablet computers increases, board area and board size restrictions also increase, and the use of the interposer assemblies with through vias can meet these requirements. These techniques apply to semiconductor wafers, where through via connections, conductive patterning for connecting components, and component mounting may be performed.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A die-on-interposer assembly with a dam structure and a method of manufacturing the same are provided in accordance with various embodiments. The intermediate stages of forming a die-on-interposer assembly in accordance with embodiments are illustrated. The variations of the embodiments are discussed. Throughout the various views and illustrative embodiments, like reference numbers are used to designate like elements.

Figure 1A:
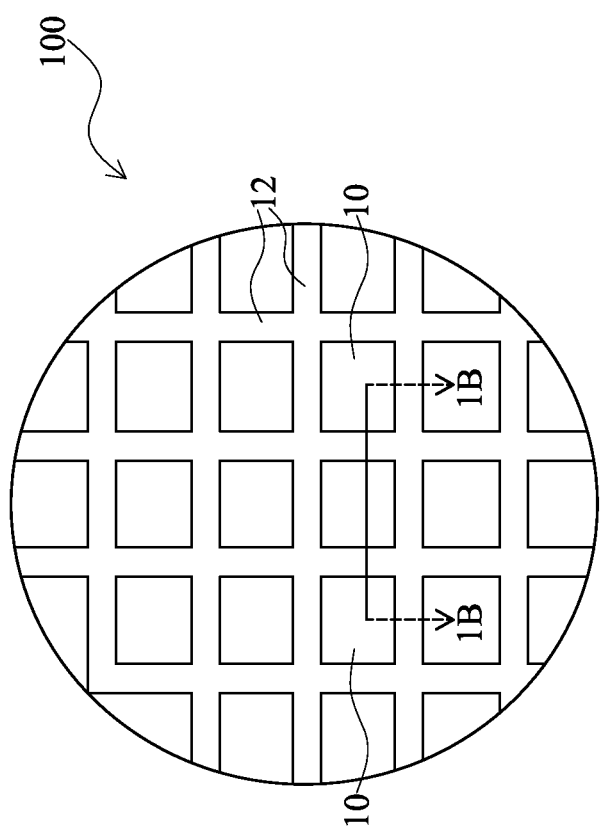
FIG. 1A is a top view of an interposer according to an embodiment.
Figure 1B:
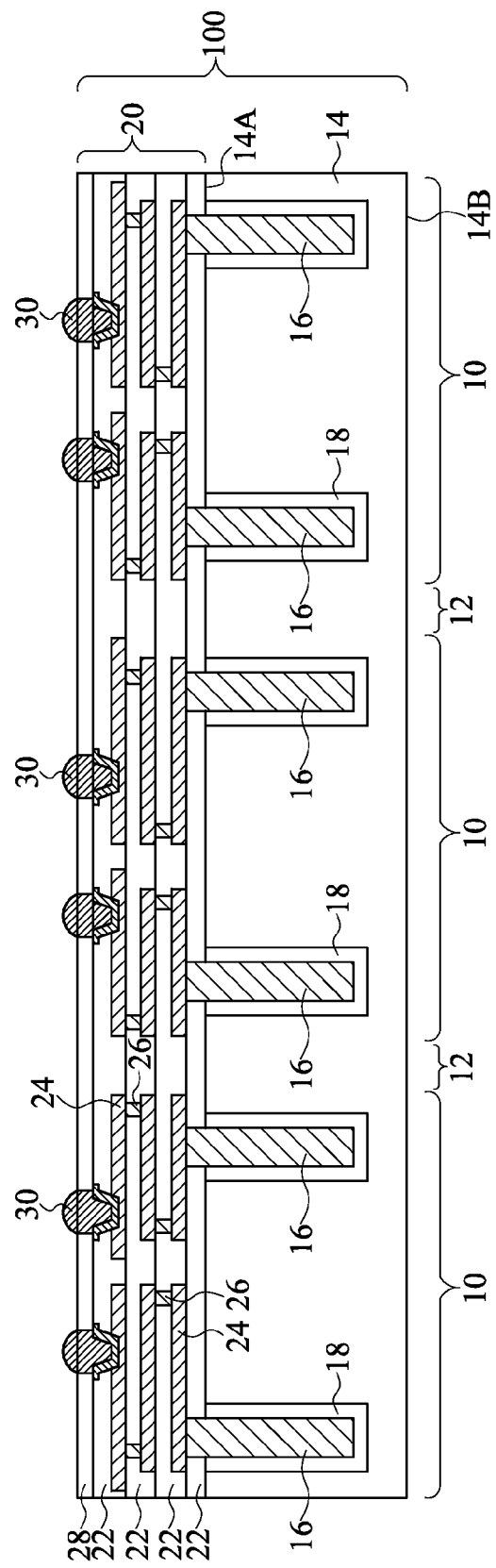
FIG. 1B is a cross-sectional view of the interposer shown in FIG. 1A.

FIG. 1A illustrates a top view of an interposer according to an embodiment. FIG. 1B illustrates a cross-sectional view of the interposer shown in FIG. 1A according to an embodiment, wherein the cross-sectional view in FIG. 1B is taken along the line 1B-1B shown in FIG. 1A in FIG. 1A. Referring to FIG. 1A, a semiconductor wafer 100 including a plurality of chip areas (or die areas) 10 with interconnect structures and metal bumps manufactured thereon is provided. In an embodiment, the semiconductor wafer 100 comprises an array of chip areas 10 separated from each other by two sets of intersecting scribe line regions 12. One set of scribe line regions 12 extend along a first direction and a second set of scribe line regions 12 extend along a second direction. In accordance with an embodiment, structures formed on the chip areas 10 are described in detail below.

Referring to FIG. 1B, semiconductor processes are performed on the semiconductor wafer 100 to form through substrate via (TSV) structure 16 in a semiconductor substrate 14, interconnect structure 20 on the semiconductor substrate 14, and metal bumps 30 on the interconnect structures 20.

The semiconductor substrate 14 may include, for example, bulk silicon, doped or undoped, or an active layer of a semiconductor-on-insulator (SOI) substrate. Other substrates, such as a multi-layered or gradient substrate may also be used. The semiconductor substrate 14 includes a frontside 14A and a backside surface 14B. In some embodiments, electrical circuitry (not shown) is formed in and/or on the frontside 14A of the semiconductor substrate 14. For example, the electrical circuitry may include various active devices and/or passive devices interconnected to perform one or more functions. The active devices may include N-type metal-oxide semiconductor (NMOS), P-type metal-oxide semiconductor (PMOS) devices and other types of transistors, and the passive devices may include capacitors, resistors, diodes, photo-diodes, fuses, and the like. The performed functions may include memory structures, processing structures, sensors, amplifiers, power distribution, input/output circuitry, or the like. In some embodiments, there is no active device formed in and/or on the frontside 14A of the semiconductor substrate 14.

The TSV structures 16 are conductive vias extending from the frontside 14A into a depth of the semiconductor substrate 14. In some embodiments, the TSV structure 16 includes a metal via, and a barrier layer lining the sidewalls of the metal via. The metal via may be formed of copper, copper alloy, tungsten, tungsten alloy or the like. The barrier layer (not shown) functions as a diffusion barrier and may be formed of refractory metals, refractory metal-nitrides, refractory metal-silicon-nitrides and combinations thereof. For example, TaN, Ta, Ti, TiN, TiSiN, WN, or combinations thereof may be used. In some embodiments, an insulation layer 18 is formed between the TSV structure 16 and the semiconductor substrate 14 so as to isolate the TSV structure 16 from other connections formed in the semiconductor substrate 14. The insulation layer 18 may include an oxide layer formed by thermal oxidation process or using any of a variety of techniques, including SACVD (sub-atmospheric chemical vapor deposition), PECVD (plasma-enhanced chemical vapor deposition), PEALD (plasma-enhanced atomic layer deposition), and future-developed deposition procedures.

The interconnect structure 20 is formed over semiconductor substrate 14, and is used to electrically connect to the TSV structures 16 and electrical circuitry formed in the semiconductor substrate 14. The interconnect structure 20 may include a plurality of dielectrics layers 22, metal lines 24 and metal vias 26. The dielectric layers 22 may include interlayer dielectric (ILD) and/or inter-metal dielectric (IMDs). The metal lines 24 are formed in dielectric layers 22, wherein the metal lines 24 that are in a same dielectric layer 22 are in combination referred to as a metal layer. The metal vias 26 are formed between, and interconnecting, metal lines 24 in different metal layers. In an embodiment, the dielectric layers 22 includes at least one, and possibly a plurality of, low-k dielectric layer(s) having low dielectric constant (k) values. The k values of the low-k dielectric materials in the dielectric layer 22 may be lower than about 3.0, or lower than about 2.5, for example. The interconnect structure 20 further includes passivation layer(s) 28 over the dielectric layers 22 according to some embodiments. Additional layers such as polyimide layers (not shown), post-passivation interconnects (PPIs, not shown), may also be formed on and/or in the passivation layer(s) 28.

The first bump structures 30 are formed over and electrically connected to the interconnect structure 20. In some embodiment, the first bump structures 30 are copper bumps, solder bumps or combinations thereof. In alternative embodiments, each first bump structure 30 includes a copper post and a solder cap, wherein a nickel layer and gold layer, a palladium layer or combinations thereof can be added between the copper post and the solder cap.

Figure 2:
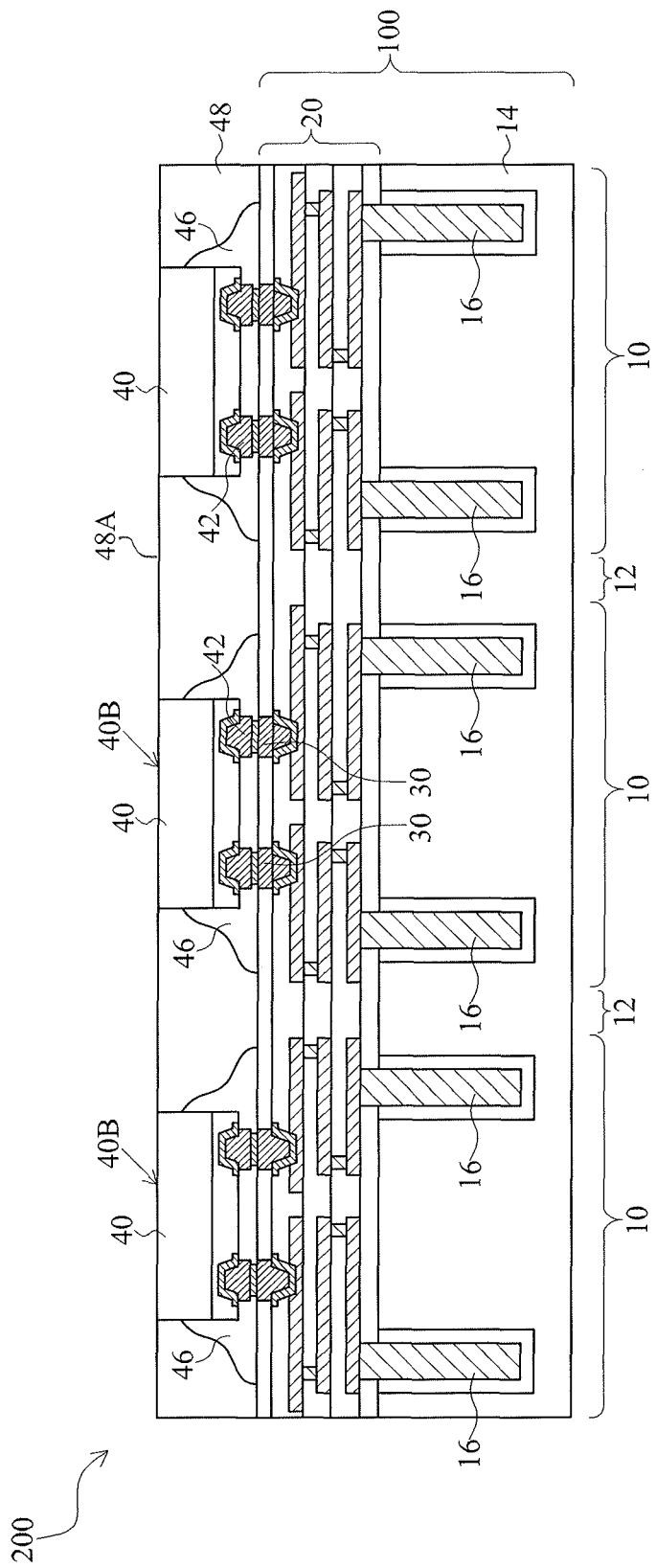
FIG. 2 is a cross-sectional view illustrating the formation of a die-on-wafer assembly in accordance with various embodiments.

FIG. 2 is a cross-sectional view illustrating the formation of a die-on-wafer assembly, in which dies 40 are bonded to the chip areas 10 of the semiconductor wafer 100, respectively. In an embodiment, the dies 40 are attached to the chip areas 10 through flip-chip bonding, in which second bump structures 42 of the dies 40 are bonded to the first bump structures 30 of the semiconductor wafer 100. The dies 40 may be device dies including logic circuit dies, memory dies, or the like, or may be packages including a die bonded to an interposer, a package substrate, and/or the like. Underfill 46 is dispensed into the space between dies 40 and the semiconductor wafer 100 in accordance with some embodiments, and then the underfill 46 is cured. Next, a polymer layer 48 is molded on the dies 40 and semiconductor wafer 100. In an embodiment, the polymer layer 48 is molding compound, epoxy, or the like. The polymer layer 48 may cover the dies 40, the underfill 46 and the passivation layer 28. In an embodiment, after the curing of the polymer layer 48, a planarization step, such as a grinding, is performed to level the top surface of polymer layer 48. The top surface 48A of remaining portion of polymer layer 48 may be higher than, or level with the backside surfaces 40B of dies 40. The structure shown in FIG. 2 is a die-on-wafer assembly 200 wherein the dies 40 is bonded to the semiconductor wafer 100 that functions as an interposer wafer.

Figure 3:
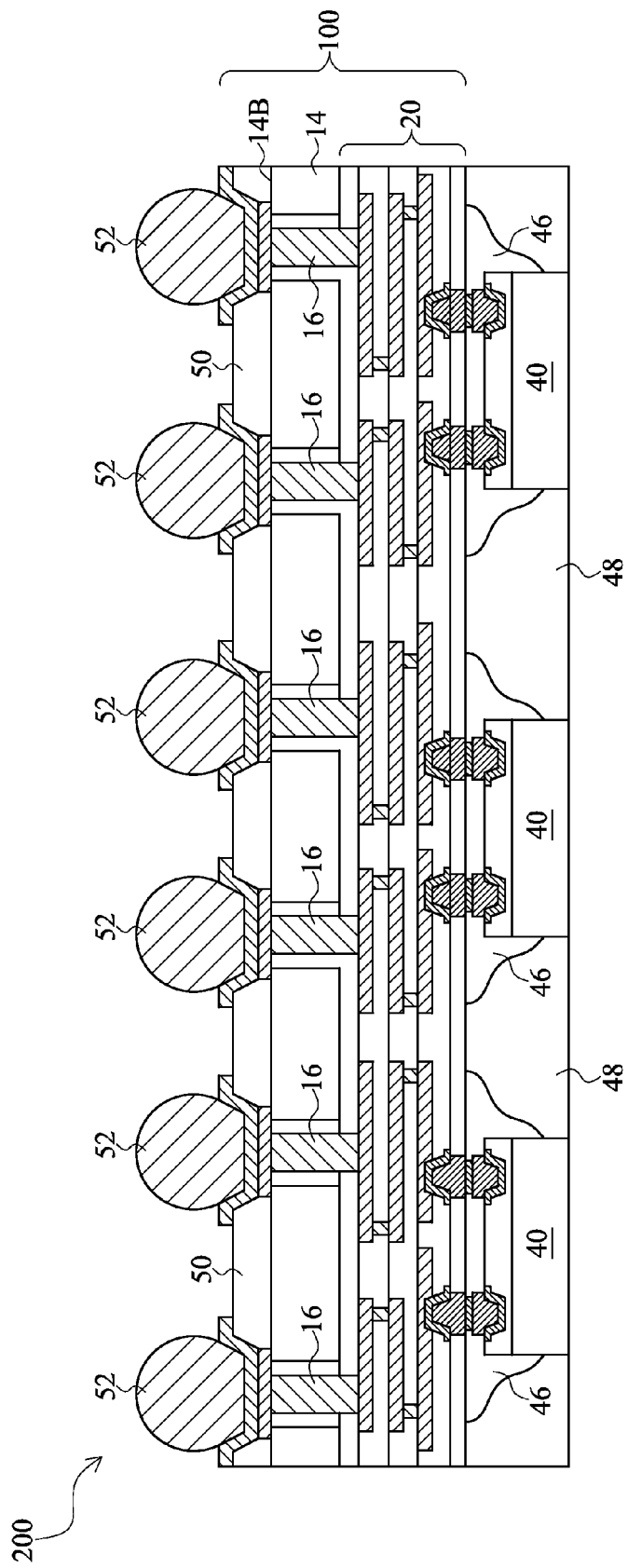
FIG. 3 is a cross-sectional view illustrating the formation of backside structure of the semiconductor wafer shown in FIG. 2.

FIG. 3 is a cross-sectional view illustrating the formation of backside structure of the semiconductor wafer 100. The die-on-wafer assembly 200 shown in FIG. 3 is flipped upside down, and semiconductor substrate 14 faces upwardly. A backside grinding is performed on the backside surface 14B of semiconductor substrate 14 to thin down the semiconductor substrate 14, until the TSV structures 16 are exposed. Dielectric layer(s) 50 and third bump structures 52 are formed on the backside surface 14B of semiconductor substrate 14, in which the third bump structures 52 are formed on the chip areas 10 and electrically coupled to the TSV structures 16 in accordance with some embodiments. In an embodiment, the third bump structures 52 are solder bumps. Redistribution lines (RDLs, not shown) may be optionally formed on and/or in the dielectric layer(s) 50, wherein the formation process may be similar to the formation of the metal lines and vias in dielectric layers 30. The third bump structures 52 may be used to bond to an additional electrical component (not shown), which may be a package substrate, a printed circuit board (PCB), or the like. For example, the diameter of the third bump structure 58 is greater than the diameter of the first bump structure 30 or the diameter of the second bump structure 42.

FIGS. 4 through 7 are bottom views illustrating intermediate stages in the formation of dam structures on the backside of the die-on-wafer assembly 200 in accordance with various embodiments.

Figure 4:
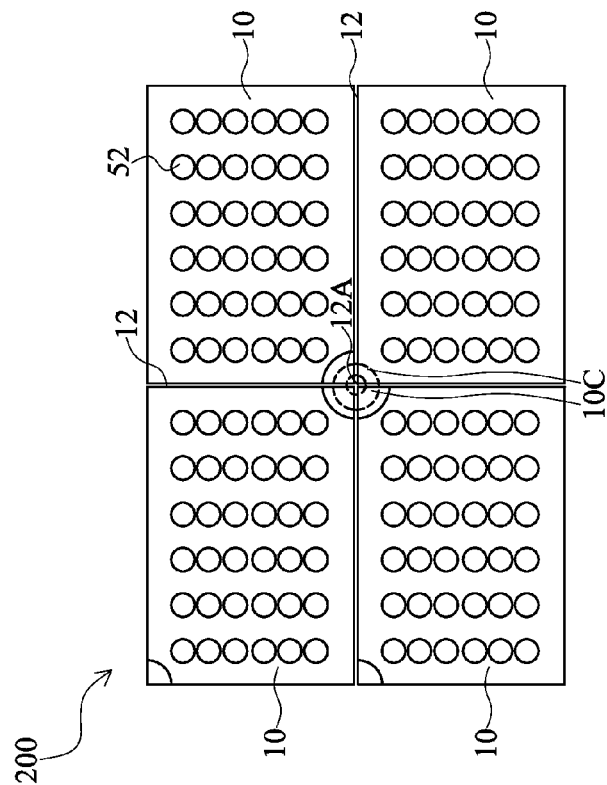

FIG. 4 is a bottom view of the die-on-wafer assembly 200, on which an array of third bump structures 52 is formed on each chip area 10 on the backside of the semiconductor wafer 100. The neighboring chip areas 10 are separated by the scribe line regions 12, and the scribe line regions 12 form crossed portions 12A on which dam structures will be provided. Each chip area 10 includes four corner areas 10C adjacent to the crossed portions 12A, and the subsequently formed dam structures will extend to the four corner areas 10C according to some embodiments.

Figure 5:
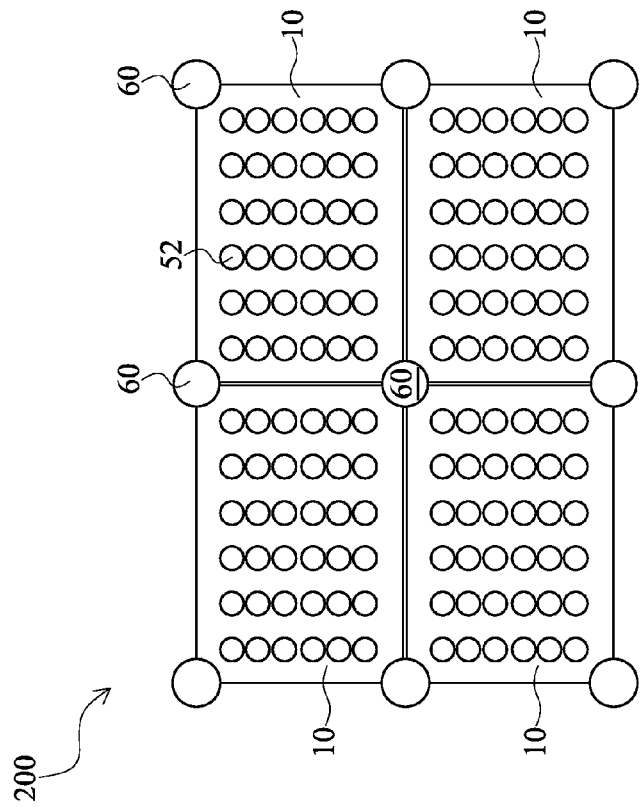
FIGS. 4 through 7 are bottom views illustrating intermediate stages in the formation of dam structures on backside of the die-on-wafer assembly in accordance with various embodiments.

Referring to FIG. 5, dam structures 60 are formed on the backside of the semiconductor wafer 100. In an embodiment, the dam structures 60 are formed on the dielectric layer(s) 50 adjacent to some bump structures 52, without electrically connecting to the interconnect structure 20. The dam structures 60 are located on the crossed portions 12A and extending to corner areas 10C of neighboring chip areas 10, forming a grid array of dam structures 60 on the backside of the die-on-wafer assembly 200. The dam structure 60 has a width ($W_d$) greater than or equal to the width ($W_s$) of the scribe line region 12. For example, $W_d \geq 80$ μm. In some embodiments, the width ($W_d$) is greater than or equal to the width ($W_b$) of the third bump structure 52. For example, $W_d \geq (1\sim4)*W_b$. The dam structure 60 has a height that may be as much as, or somewhat smaller than, the height ($H_b$) of the third bump structure 52. The material for the dam structure 60 may be selected from various materials compatible with wafer level processing and packaging, provided it has high adhesive properties. In an embodiment, the dam structure 60 is formed of a polymer material. For example, dispensed liquid material such as an epoxy or resin and the like may be used. A curing step may be performed to cure the dam structure 60. In some embodiments, the dam structures 60 will partially remain on the chip areas 10 after a subsequent dicing process so as to control the gap between the assembly and another substrate. In some embodiments, the dam structures 60 may be considered as "stress relief features" that can form supports between the neighboring chip areas 10 and create a grid matrix to reduce or eliminate wafer-form warpage.

Figure 7:
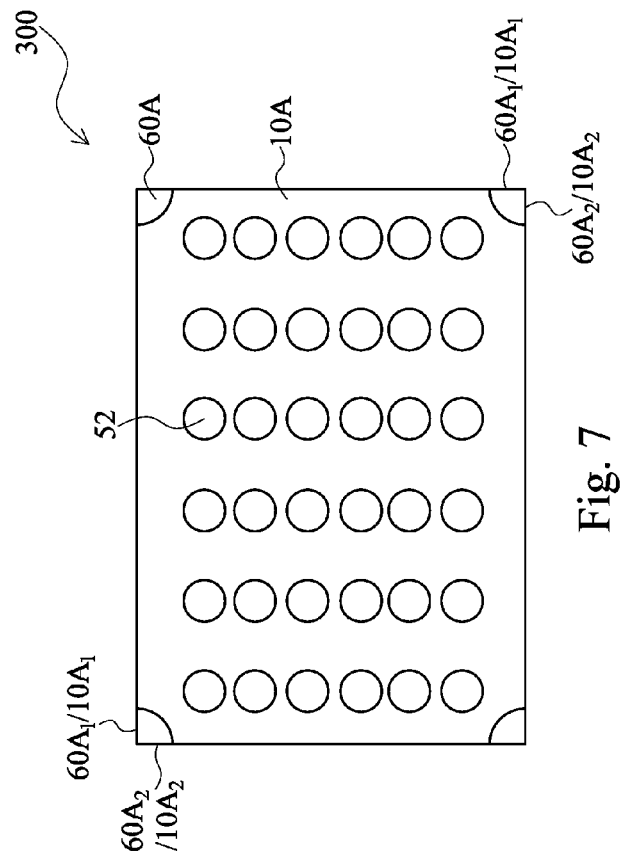
Figure 6:
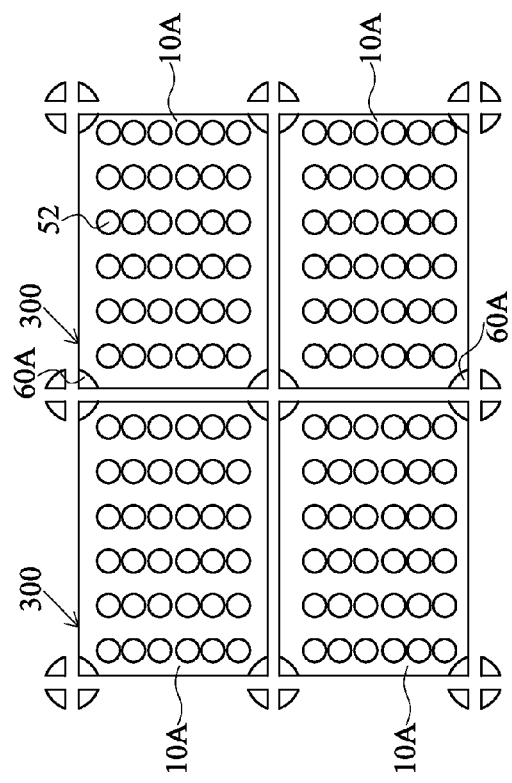

Next, referring to FIG. 6, a dicing process is performed on the scribe line regions 12 to separate individual assemblies 300 from each other, and accordingly the chip areas 10 of the wafer 100 are diced into a plurality of interposer chips 10A bonded to the respective dies 40. For example, a blade or laser is used in the dicing process. In at least one embodiment, the individual assembly 300 includes the die 40 bonded to the interposer chip 10A for connecting the die 40 to another substrate, so that the individual assembly 300 is also considered as a die-on-interposer assembly 300. During the dicing process, each dam structure 60 is cut into four portions 60A remaining on the four corner areas 10C of the interposer chip 10A, and thus the remaining portions 60A function as dam structures on the backside of the die-on-interposer assembly 300. As shown in FIG. 7, in the die-on-interposer assembly 300, the dam structures 60A are formed on the four corner areas 10C of the interposer chip 10A, in which four corner areas 10C are defined by a pair of first corner edges $10A_1$ and second corner edges $10A_2$. Accordingly, as shown in FIG. 7, the outer edges $60A_1$ and $60A_2$ of the dam structure 60A are substantially aligned to the corner edges $10A_1$ and $10A_2$ of the interposer chip 10A.

Figure 8:
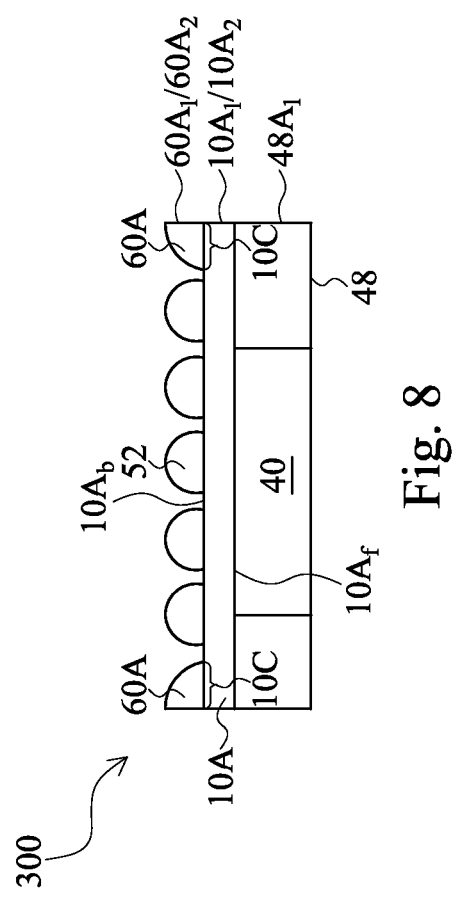
FIG. 8 is a cross-sectional view illustrating the die-on-interposer assembly shown in FIG. 7.

FIG. 8 is a cross-sectional view illustrating the die-on-interposer assembly 300 shown in FIG. 7, wherein the third bump structures 52 and dam structures 60A face upwardly. Unless specified otherwise, the reference numerals in these embodiments represent like elements in the embodiments illustrated in FIGS. 1~3. In the die-on-interposer assembly 300, the die 40 is bonded onto the frontside $10A_f$ of the interposer chip 10A and surrounded by the polymer layer 48, the bump structures 52 are formed on the backside $10A_b$ of the interposer chip 10A, and the dam structures 60A are formed on the corner areas 10C at the backside $10A_b$ of the interposer chip 10A. The corner area 10C is defined by the corner edges $10A_1$ and $10A_2$. In an embodiment, the outer edge $60A_1$ or $60A_2$ of the dam structure 60A is substantially aligned to the corner edges $10A_1$ of the interposer chip 10A. In an embodiment, outer edge $60A_1$ or $60A_2$ of the dam structure 60A is substantially aligned to the outer edges $48A_1$ of the polymer layer 48.

Figure 9:
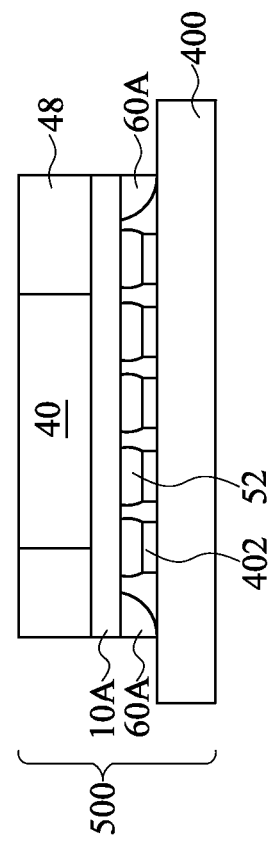
FIG. 9 is a cross-sectional view illustrating the formation of a die-on interposer assembly on a substrate in accordance with various embodiments.

Other packaging processes can be followed after the completion of the formation of dam structures 60A on the die-on-interposer assembly 300. FIG. 9 is a cross-sectional view illustrating the formation of a die-on interposer assembly on a substrate in accordance with various embodiments. Unless specified otherwise, the reference numerals in these embodiments represent like elements in the embodiments illustrated in FIGS. 1~3. The die-on-interposer assembly 300 is attached to a substrate 400 to form a semiconductor package 500. The substrate 400 may be an organic substrate, a circuit board, a dielectric substrate or a semiconductor substrate with high-density interconnects. In an embodiment, the substrate 400 is a printed circuit board (PCB) made of fiberglass or a similar material and including electrical wires printed onto the board for connecting various components and packages. The die-on-interposer assembly 300 is electrically coupled to the substrate 400 by connecting the third bump structures 52 to connectors 402 on the substrate 400. In some embodiments, the connectors 402 are formed of copper, copper alloy, tin, tin alloy, gold, nickel, palladium, or combinations thereof. Optionally a reflow process is performed to joint the third bump structures 52 and the connectors 402 respectively. In the resulted package 500, the dam structures 60A contact the substrate 400 according to some embodiments. The dam structure 60A becomes an obstacle to control the gap between the assembly 300 and the substrate 400 and therefore prevent bump bridging during the reflow process and/or bump crack during the reflow cooling process due to CTE (coefficient of thermal expansion) mismatch and warpage mismatch between the interposer chip 10A and the substrate 400. Compared with approaches of dispensing epoxy dams on a package substrate with surface condition deviation, the present disclosure provides the dam structures 60 on dielectric layer(s) of the wafer-form assembly 200 before attaching to the substrate 400 such that the height and width of the dam structures are more easily controlled and the throughput and stability of the dam formation are significant improved.

Figure 10:
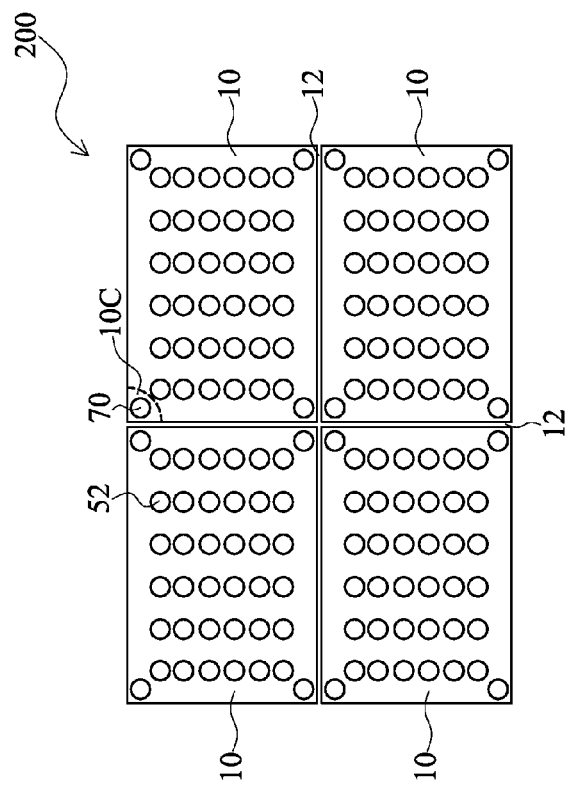
FIG. 10 is a bottom view illustrating the formation of dam structures on backside of a die-on-wafer assembly in accordance with other embodiments.

FIG. 10 is a bottom view illustrating the formation of dam structures on backside of a die-on-wafer assembly in accordance with other embodiments. Unless specified otherwise, the reference numerals in these embodiments represent like elements in the embodiments illustrated in FIGS. 4~7. Dam structures 70 are provided on corner areas 10C of neighboring chip areas 10, forming a grid array of dam structures 70 on the backside of the die-on-wafer assembly 200. In an embodiment, the width ($W_d$) is equal to the width ($W_b$) of the third bump structure 52. In some embodiments, the width ($W_d$) is greater than or less than the width ($W_b$) of the third bump structure 52. The dam structure 70 has a height that may be as much as, or somewhat smaller than, the height ($H_b$) of the third bump structure 52. In an embodiment, the dam structure 70 is formed of a polymer material. For example, dispensed liquid material such as an epoxy or resin and the like may be used. A curing step may be performed to cure the dam structures 70.

Figure 11:
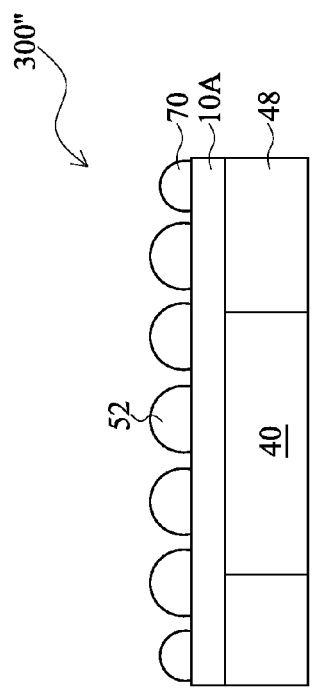
FIG. 11 is a cross-sectional view illustrating an individual assembly as shown in FIG. 10.

FIG. 11 is a cross-sectional view illustrating an individual assembly 300" separated from the die-on-wafer assembly 200 as shown in FIG. 10. Unless specified otherwise, the reference numerals in these embodiments represent like elements in the embodiments illustrated in FIG. 7. After performing a dicing process on the scribe line regions 12, a plurality of die-on-interposer assemblies 300" are separated. In at least one embodiment, the individual assembly 300" includes the die 40 bonded to the interposer chip 10A for connecting the die 40 to another substrate, and includes at least one dam structure 70 on the backside corner area 10C of the interposer chip 10A.

Figure 12:
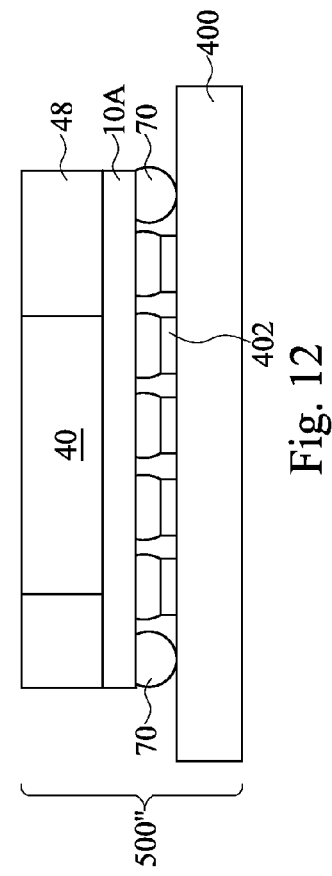
FIG. 12 is a cross-sectional view illustrating the formation of a die-on interposer assembly on a substrate in accordance with various embodiments.

FIG. 12 is a cross-sectional view illustrating the formation of a die-on interposer assembly 300" on a substrate 400 in accordance with various embodiments. Unless specified otherwise, the reference numerals in these embodiments represent like elements in the embodiments illustrated in FIG. 9. The die-on-interposer assembly 300" is attached to a substrate 400 to form a semiconductor package 500". The die-on-interposer assembly 300" is electrically coupled to the substrate 400 by connecting the third bump structures 52 to connectors 402 on the substrate 400. Optionally a reflow process is performed to join the third bump structures 52 and the connectors 402 respectively. In the resulted package 500", the dam structures 70 contact the substrate 400 according to some embodiments. The dam structure 70 becomes an obstacle to control the gap between the assembly 300" and the substrate 400.

According to some embodiments, a semiconductor package includes an interposer chip having a frontside, a backside, and a corner area on the backside defined by a first corner edge and a second corner edge of the interposer chip; a die bonded to the frontside of the interposer chip; and at least one dam structure on the corner area of the backside of the interposer chip. The dam structure includes an edge aligned to at least one the first corner edge and the second corner edge of the interposer chip.

According to some embodiments, a method of forming an assembly including: receiving a wafer having a frontside, a backside, and a plurality of chip areas separated by scribe line regions; bonding a die to the frontside of the wafer to form a die-on-wafer assembly; forming a plurality of dam structures on crossed portions of the scribe line regions on the backside of the wafer; and performing a dicing process on the scribe line regions to separate the die-on-wafer assembly into a plurality of individual assemblies.

According to some embodiments, a semiconductor package includes an interposer chip having a frontside, a backside, and four corner areas on the backside defined by a pair of first corner edges and second corner edges of the interposer chip; a die bonded to the frontside of the interposer chip; a polymer layer formed on the frontside of the interposer chip and surrounding the die; four polymer dam structures on the four corner areas of the backside of the interposer chip, wherein each of the four polymer dam structures includes a first edge aligned to the first corner edge of the interposer chip, and a second edge aligned to the second corner edge of the interposer chip; and a substrate bonded to the backside of the interposer chip, wherein the four polymer dam structures are positioned between the substrate and the interposer chip.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A semiconductor package, comprising:
an interposer chip having a frontside, a backside, and a corner area on the backside defined by a first corner edge and a second corner edge of the interposer chip;
a plurality of bump structures on the backside of the interposer chip, an intersection of the first corner edge and the second corner edge being a first distance from a nearest bump structure of the plurality of bump structures;
a die bonded to the frontside of the interposer chip; and
at least one dam structure on the corner area of the backside of the interposer chip, the at least one dam structure comprising an edge aligned to at least one of the first corner edge and the second corner edge of the interposer chip, the at least one dam structure extending along the first corner edge a second distance, and the dam structure extending along the second corner edge a third distance, the second distance and the third distance each being less than or equal to the first distance, the at least one dam structure comprising at least a part of a sphere extending from the backside of the interposer chip.

2. The semiconductor package of claim 1, further comprising a polymer layer on the frontside of the interposer chip and surrounding the die.

3. The semiconductor package of claim 2, wherein the polymer layer comprises an outer edge aligned with the edge of the dam structure.

4. The semiconductor package of claim 1, wherein the at least one dam structure comprises polymer.

5. The semiconductor package of claim 1, wherein the interposer chip comprises:
a semiconductor substrate having a first side and a second side opposite to the first side;
a through substrate via penetrating the semiconductor substrate;
an interconnect structure formed on the first side of the semiconductor substrate and electrically connected to the through substrate via; and
a plurality of bump structures formed on the second side of the semiconductor substrate and electrically connected to the through substrate via.

6. The semiconductor package of claim 5, wherein the at least one dam structure is formed on the second side of the semiconductor substrate without being electrically connected to the through substrate via.

7. The semiconductor package of claim 1, further comprising a substrate bonded to the backside of the interposer chip, wherein the at least one dam structure is located in a gap between the substrate and the interposer chip.

8. A method of forming an assembly, comprising:
receiving a wafer having a frontside and a backside, wherein the wafer comprises a plurality of chip areas separated by scribe line regions, each of the plurality of chip areas comprising four corner areas adjacent to crossed portions of the scribe line regions;
bonding a die to the frontside of the wafer to form a die-on-wafer assembly;
forming a plurality of dam structures on the crossed portions of the scribe line regions on the backside of the wafer; and
performing a dicing process on the scribe line regions to separate the die-on-wafer assembly into a plurality of individual assemblies, wherein after performing the dicing process, each of the four corner areas of each of the plurality of chip areas includes at least a portion of one of the plurality of dam structures, each of the remaining portions of the dam structures being at least a part of a circle in a plane parallel to the backside of the wafer.

9. The method of claim 8, wherein the dam structures are formed to extend to the four corner areas.

10. The method of claim 8, wherein each of the remaining portions of the dam structures comprise an edge aligned with an outer edge of the individual assembly after performing the dicing process.

11. The method of claim 8, wherein forming the plurality of dam structures comprises dispensing a liquid polymer material.

12. The method of claim 8, further comprising forming a plurality of bump structures on the backside of the wafer before forming the plurality of dam structures.

13. The method of claim 8, further comprising forming a polymer layer on the frontside of the wafer to surround the die.

14. The method of claim 8, wherein the wafer comprises:
a semiconductor substrate having a first side and a second side opposite to the first side;
a through substrate via penetrating the semiconductor substrate;
an interconnect structure formed on the first side of the semiconductor substrate and electrically connected to the through substrate via; and
a plurality of bump structures formed on the second side of the semiconductor substrate and electrically connected to the through substrate via.

15. The method of claim 14, wherein the plurality of dam structures is not electrically connected to the through substrate via.

16. A semiconductor package, comprising:
an interposer chip having a frontside, a backside, and four corner areas on the backside defined by a pair of first corner edges and second corner edges of the interposer chip;
a die bonded to the frontside of the interposer chip;
a polymer layer formed on the frontside of the interposer chip and surrounding the die;
four polymer dam structures on the four corner areas of the backside of the interposer chip, wherein each of the four polymer dam structures comprises a first edge aligned to the first corner edge of the interposer chip, a second edge aligned to the second corner edge of the interposer chip, and a third edge connecting the first edge and the second edge of the polymer dam structure, the third edge being at least a part of a circle in a plane parallel to the backside of the of the interposer chip, wherein each of the four polymer dam structures comprises at least a part of a sphere extending from the backside of the interposer chip; and a substrate bonded to the backside of the interposer chip, wherein the four polymer dam structures are positioned between the substrate and the interposer chip.

17. The semiconductor package of claim 16, wherein the first edge of each of the four polymer dam structures is aligned to an outer edge of the polymer layer.

18. The semiconductor package of claim 16, wherein the interposer chip comprises:
   a semiconductor substrate having a first side and a second side opposite to the first side;
   a through substrate via penetrating the semiconductor substrate; and
   an interconnect structure on the first side of the semiconductor substrate and electrically connected to the through substrate via; and
   a plurality of bump structures on the second side of the semiconductor substrate and electrically connected to the through substrate via;
   wherein the plurality of bump structures are positioned between the substrate and the interposer chip.

* * * * *